United States Patent

Weber et al.

Patent Number: 5,701,037
Date of Patent: Dec. 23, 1997

[54] ARRANGEMENT FOR INDUCTIVE SIGNAL TRANSMISSION BETWEEN THE CHIP LAYERS OF A VERTICALLY INTEGRATED CIRCUIT

[75] Inventors: Werner Weber; Stefan Kuehn; Michael Kleiner, all of Munich; Roland Thewes, Puchheim, all of Germany

[73] Assignee: Siemens Aktiengesellschaft, Munich, Germany

[21] Appl. No.: 549,068

[22] Filed: Oct. 27, 1995

[30] Foreign Application Priority Data

Nov. 15, 1994 [DE] Germany ............ 44 40 864.1

[51] Int. Cl.[6] .......... H01L 23/48; H01L 23/52; H01L 29/40
[52] U.S. Cl. .......... 257/777; 257/679; 257/531
[58] Field of Search ............ 257/777, 531, 257/679

[56] References Cited

U.S. PATENT DOCUMENTS 4,960,983 10/1990 Inoue ............ 235/449
5,424,527 6/1995 Takahira .

FOREIGN PATENT DOCUMENTS 42 15 955 12/1993 Germany .
42 15 956 4/1994 Germany .

OTHER PUBLICATIONS

P. Horowitz & W. Hill The Art of Electronics Cambridge 1989.

"The 3D Interconnection—Application for Mass Memories and Microprocessors," Val et al., Proc. of the 1991 Int. Symp. on Microelectronics, pp. 62–68.

"Future WSI Technology: Stacked Monolithic WSI," Williams et al., IEEE Trans. on Comp., Hybrids, and Mfg. Tech., vol. 16, No. 7, Nov., 1993, pp. 610–614.

*Primary Examiner*—Sara W. Crane
*Assistant Examiner*—Douglas A. Wille
*Attorney, Agent, or Firm*—Hill, Steadman & Simpson

[57] ABSTRACT

In an arrangement for signal transmission between chip layers of a vertically integrated circuit, a defined, inductive signal transmission ensues between a part of the vertically integrated circuit in one chip layer and a further part of the vertically integrated circuit in a further chip layer by means of a coupling inductance formed by respective coils in the two layers. Particularly given high connection densities, a large number of freely placeable and reliable vertical signal connections can be produced directly from the inside of one chip layer to the inside of a neighboring chip layer without extremely high demands being made on the adjustment of the chip layers relative to one another and on the surface planarity of the individual chip layers.

9 Claims, 5 Drawing Sheets

TRANSMISSION STAGE

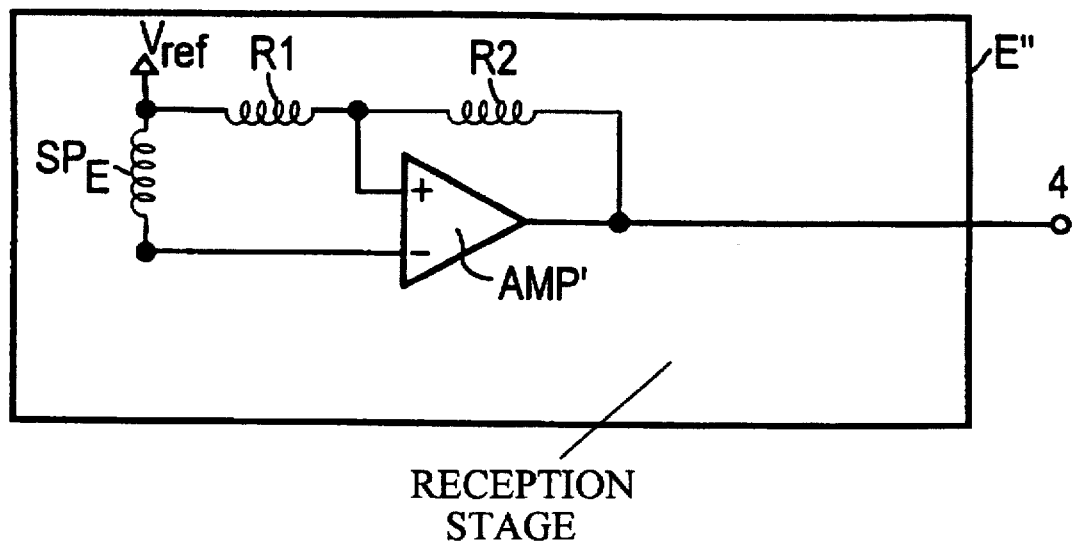
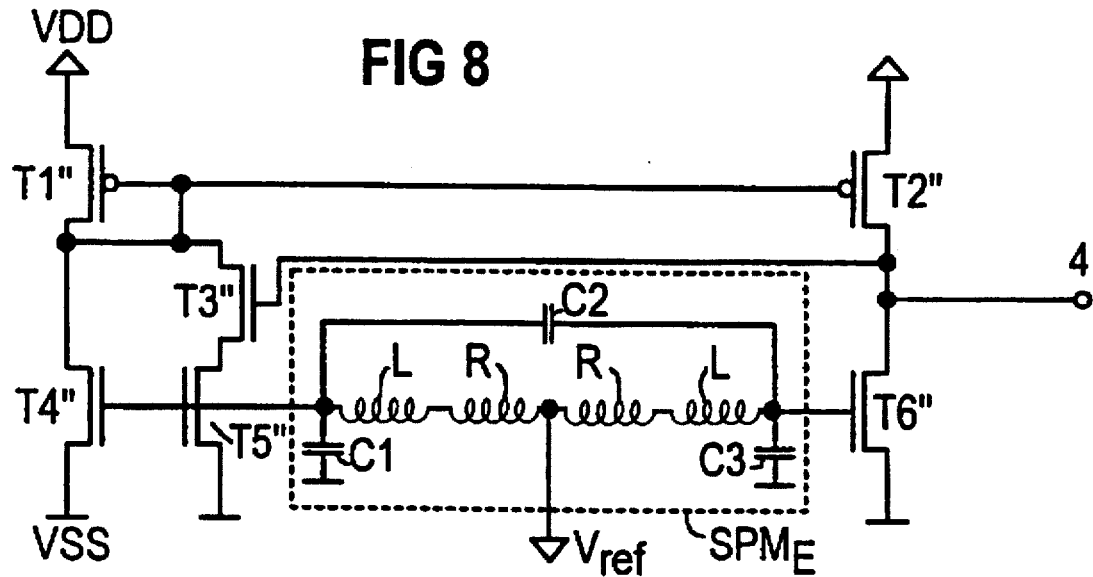

ARRANGEMENT FOR INDUCTIVE SIGNAL TRANSMISSION BETWEEN THE CHIP LAYERS OF A VERTICALLY INTEGRATED CIRCUIT

BACKGROUND OF THE INVENTION

1. Field of the Invention

The present invention is directed to a vertically integrated semiconductor ship arrangement, and to a method for making such a chip arrangement, wherein electrical signals are transmitted between circuit portions disposed in different chips.

2. Description of the Prior Art

Integrated circuits are currently manufactured primarily in planar technique. The complexity that can be achieved on a single semiconductor chip, however, is limited by the dimensions thereof and by the process technology employed for the manufacture thereof.

For enhancing the performance capability, solutions are being currently pursued wherein a number of layers of semiconductor chips are vertically integrated, i.e., layers are arranged above one another and electrically connected. In vertically integrated circuits, referred to in brief below as VICs, a three-dimensional circuit structure is composed of a stack of individual chip layers processed independently of one another, that are usually connected with glue layers. To that end, the individual chip layers can be "thinned down" to an appropriate thickness before assembly, i.e. etched down or ground down, in order to assure good electrical properties and a high connection density. In SOI technologies (silicon on insulator), the buried oxide is available as an etch stop for the "thinning" of the wafers. In conventional silicon technologies, the substrate can be thinned down to the field oxide regions or layer of MOSFETs contained in a chip layer, or may still have a substrate layer a few μm thick at the underside of the chip layers.

An arrangement for galvanic signal transmission (i.e., transmission requiring a continuous flow or transfer of charge carriers) between the chip layers of a vertically integrated circuit is known from the publication of Williams R. Marsh O., "Future WSI Technology: Stacked Monolithic WSI", IEEE Transactions on CHMT, Vol. 16, No. 7, pp. 610–614. Relatively thin chip layers having a thickness of approximately 10 μm and fine metallic connections having a diameter of approximately 1 μm are thereby required in order to assure good electrical properties of the vertical signal connections, particularly given high connection densities. A significant disadvantage of this technique, however, is that extremely high demands are made on the adjustment of the chip layers relative to one another and on the planarity of the chip surfaces.

Arrangements have therefore been recently proposed, for example in the publication by Val, C., Leroy M., "The 3D Interconnection—Applications for Mass Memories and Microprocessors", Proc. 24th Symp. on ISHM, 1991, pp. 62–68, wherein the connections from chip layer to chip layer are conducted over the lateral surfaces; this, however, has the disadvantage that the vertical connections, first, cannot be freely placed and, second, the connection are orders of magnitude longer than in the aforementioned VICs.

SUMMARY OF THE INVENTION

An object of the present invention is to provide an arrangement for signal transmission between the chip layers of a vertically integrated circuit, which permits a large number of freely placeable and reliable, vertical signal connections to be present proceeding directly from the inside of one chip layer to the inside of a neighboring chip layer, and which also permits the arrangement can to be manufactured without extremely high demands on the adjustment of the chip layers relative to one another and of the planarity of the chip surfaces.

The above object is achieved in accordance with the principles of the present invention in a vertically integrated circuit having at least first and second chip layers, wherein a coupling inductance is provided, and signal transmission between one part of the circuit in the first chip layer and a different part of the circuit in a further chip layer takes place by inductive coupling via the coupling inductance. The coupling inductance is formed by two coils respectively disposed in the first and second chip layers.

A number of advantages are achieved with the invention. The signal reception means can be designed to function reliably for a relatively broad range of coupling inductance. The signal transmission also functions reliably even if, surface ripple of the chip layers and irregularities of the interlayer dielectric modify the coil spacing and, thus, the coupling inductance. Given a corresponding dimensioning of the transmission means, the reception means and the coupling inductance, a reliable signal transmission is also assured between chip layers that are not immediately adjacent to one another. The inductive signal transmission enables the evaluation of the transmission signal by various reception means in various chips levels, which, for example, facilitates the distribution of clocks or bus signals. The coils can be designed tolerant to possible lateral offsets on the basis of a suitable arrangement. The transmitter and receiver devices enable a direct, contactless testing of individual chip layers by employing adapter structures. Complicated process steps can be avoided for the manufacture of the galvanic interchip connections in the contactless signal transmission. Signal transmission ensues without significant degradation of the bandwidth.

Inductive signal transmission also has the advantage that a transmission of the information is possible with nearly all materials standard in IC process technology, thereby considerably simplifying the manufacture of the vertical contacts. Given arrangements for galvanic signal transmission between chip layers of a VIC, by contrast, the problem can arise that the transmitted signals must be conducted insulated through the electrically conductive semiconductor substrate. The inductive signal transmission can therefore be especially advantageously applied in processes with conductive substrates.

In a further embodiment of the invention, another coupling inductance (pair of coils) can be provided, allocated to the aforementioned coupling inductance, and a complementary signal (i.e., complementary relative to the signal transmitted via the aforementioned coupling inductance) is generated and is transmitted via the further coupling inductance. The original signal and its complement are then differentially evaluated upon reception thereof, providing an improvement in immunity to external interference sources as well as immunity to interference arising due to cross-coupling from neighboring conductors.

DESCRIPTION OF THE DRAWINGS

FIG. 7 is a schematic circuit diagram of a second embodiment of a reception stage of an inventive arrangement.

FIG. 8 is a detailed circuit diagram of a reception stage according to the functional principles of FIG. 7.

DESCRIPTION OF THE PREFERRED EMBODIMENTS

Figure 1:
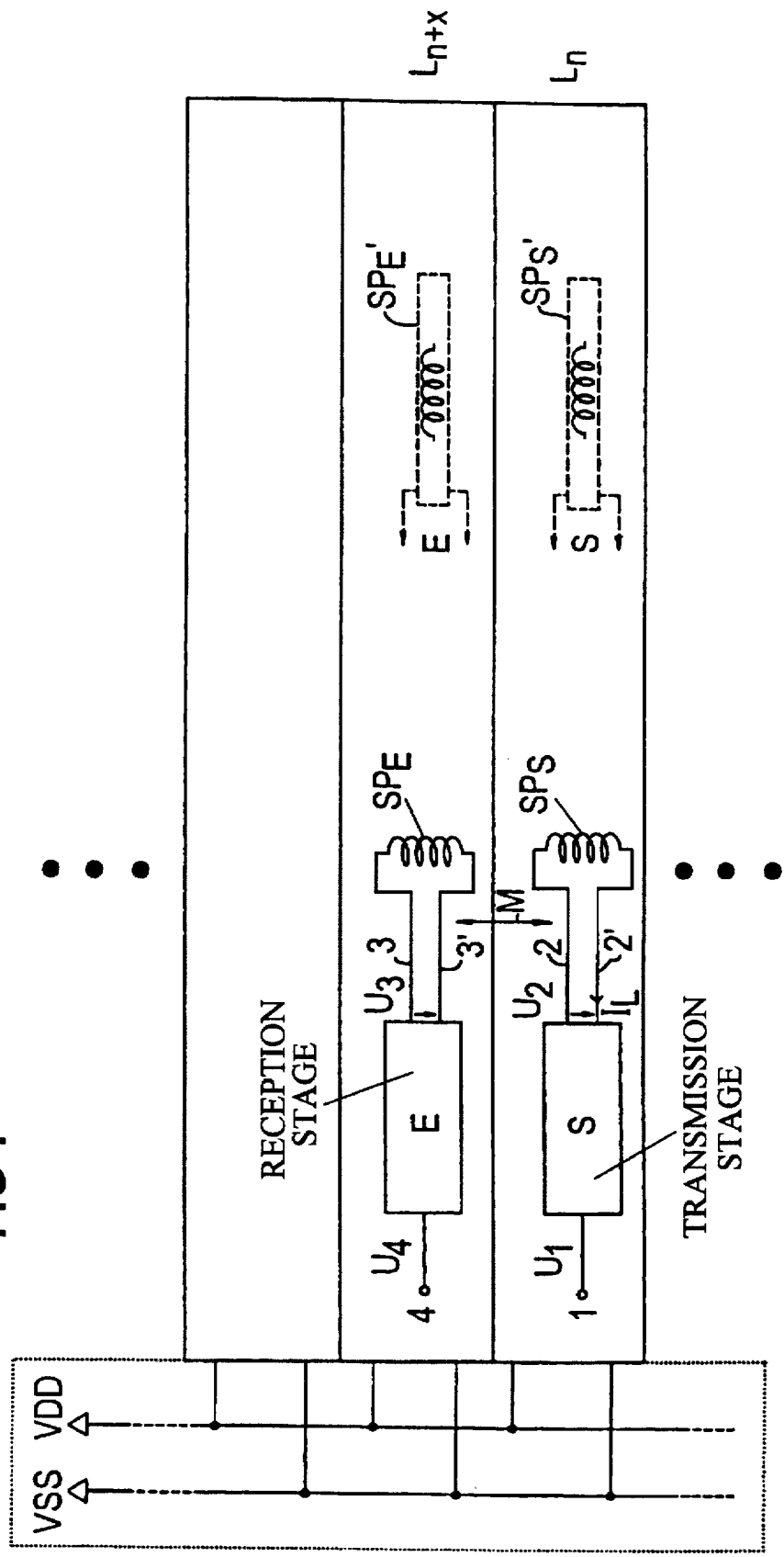
FIG. 1 illustrates an embodiment of the present invention having two neighboring chip layers of a vertically integrated circuit.

FIG. 1 shows three of a large number of stacked chip layers of a VIC. A transmission stage S is provided in a chip layer $L_n$ and a reception stage E is provided in a further chip layer $L_{n+x}$. The three chip layers are respectively supplied with supply voltages VDD and VSS. The transmission stage S has an input 1 at which a voltage $U_1$ is present and two outputs 2 and 2' between which a voltage $U_2$ is present. The two outputs 2 and 2' are connected to inputs of a transmission coil $SP_S$ in the chip layer $L_n$ and a coil current $I_L$ flows through the transmission coil $SP_S$. The reception stage E located in the chip layer $L_{n+x}$ has two inputs 3 and 3' between which a voltage $U_3$ is present and that are connected to the inputs of a reception coil $SP_E$. Further, the reception stage E has an output 4 at which a voltage $U_4$ is present. The two coils $SP_S$ and $SP_E$ are inductively coupled to one another via a coupling inductance M, a signal transmission from the chip layer $L_n$ into the chip layer $L_{n+x}$ ensuing as a result.

It is unimportant for the invention whether the transmission stage S lies in the chip layer $L_n$ or in the further chip layer $L_{n+x}$ or whether the reception stage E lies in the chip layer $L_n$ or in the chip layer $L_{n+x}$.

The two coils $SP_E$ and $SP_S$ are shown in neighboring chip layers in FIG. 1; this, however, is not compulsory, as indicated by the chip layer designation $L_{n+x}$ (i.e., x may be larger than 1). The coupling degree of the two coils, however, decreases with increasing distance between the coils but can be increased, for example, by introducing regions with high magnetic permeability between the coils in intervening chip layers.

An optional, further transmission coil $SP_S'$ in the chip layer Ln and a further reception coil $SP_E'$ in the chip layer $L_{n+x}$ are shown in FIG. 1 with broken lines, and connections of the further transmission coil $SP_S'$ to the transmission stage S as well as connections of the further reception coil $SP_E'$ to the reception stage E are likewise indicated with broken lines. Signals that are complementary to one another can be transmitted by the transmission coils $SP_S$ and $SP_S'$ and can be received by coils $SP_E$ and $SP_E'$ and be differentially evaluated in a corresponding reception unit. This has the advantage that any interference which is accidently or unavoidably coupled into the coils acts largely the same on the reception coils and the common mode part, i.e., the disturbing quantity, is substantially fully suppressed by the differential evaluation.

Figure 2:
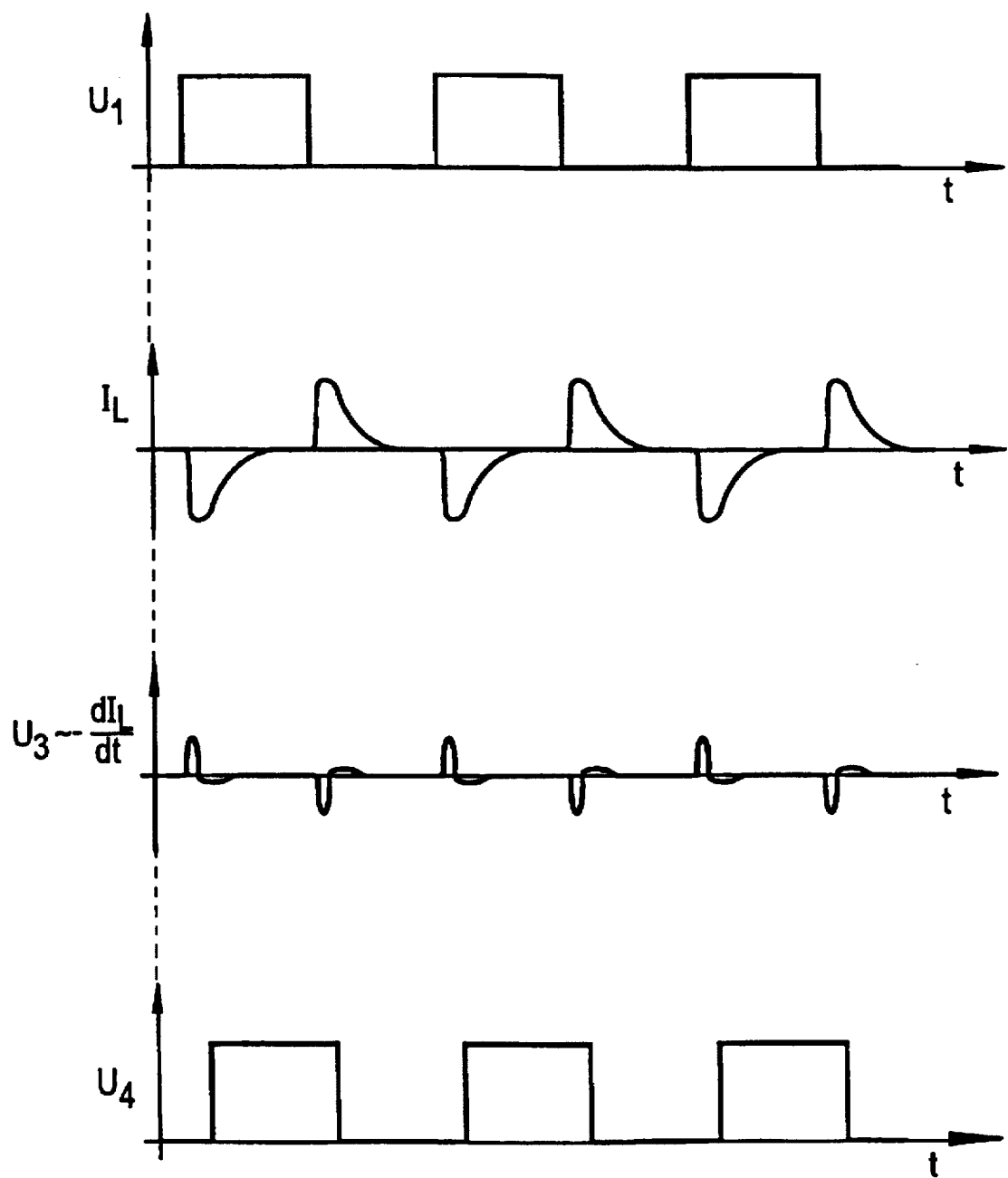
FIG. 2 is a triple voltage/time diagram for explaining the arrangement of FIG. 1.

FIG. 2 shows four time diagrams, whereby the square-wave voltage $U_1$ is shown in the first time diagram, the coil current $I_L$ is shown in the second diagram, the input voltage $U_3$ at the reception stage E is shown in the third diagram and the square-wave output voltage $U_4$ is shown in the fourth time diagram. The output voltage $U_4$ generally differs from the square-wave input voltage $U_1$ only by a time shift and by a constant factor. The coil current $I_L$ thereby exhibits a sharp drop with the leading edge of the voltage $U_1$ and subsequently rises roughly exponentially from its minimum value up to zero until, due to a negative edge of the voltage $U_1$, a steep rise of the coil current $I_L$ and a likewise subsequent, approximately exponential drop down to the value zero ensue. The voltage $U_3$ is proportional to the time derivative $-DI_L/dt$, which leads to a brief positive rise at the approximate time of the leading edges of the voltage $U_1$, or to a negative pulse at the voltage $U_3$ at each negative edge of the voltage $U_1$. The voltage $U_4$ is switched to the maximum value of the voltage $U_4$ at the approximate time of the positive pulse of the voltage $U_3$ and is switched to the minimum value of the voltage $U_4$ by the negative pulse of the voltage $U_3$.

Figure 3:
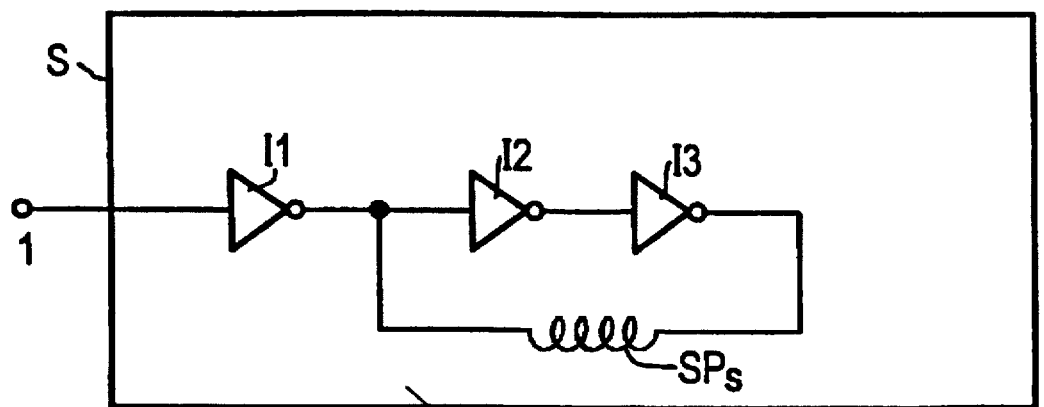
FIG. 3 is a block circuit diagram of a transmission stage of an inventive arrangement.

FIG. 3 shows an exemplary embodiment of the transmission stage S composed of three inverters I1 . . . I3 and the transmission coil $SP_S$. The input 1 is connected via the inverter I1 to the input of the inverter I2. For information transmission, a brief current pulse of corresponding polarity with a steep leading edge and a flatly dropping curve flows through the transmission coil $SP_S$ at each signal edge. This is achieved by the transmission stage S shown in FIG. 3 as a result of transit time effects through the series-connected inverters I2 and I3.

The coupling inductance M in FIG. 1 is produced by helices arranged above one another in the metallization levels of the communicating chip layers. The individual coils can thereby be realized by windings in one or more levels. In the case of coils in a number of levels, an offset arrangement of the metal tracks in the respective wiring levels can be undertaken for minimizing parasitic capacitances. The inductance forms a parasitic LCR resonant circuit with the parasitic capacitance and the internal resistance of the coil. The internal resistance of the transmitter and receiver coils $SP_S$ and $SP_E$ must be selected such that the LCR resonant circuit exhibits aperiodic behavior.

Figure 4:
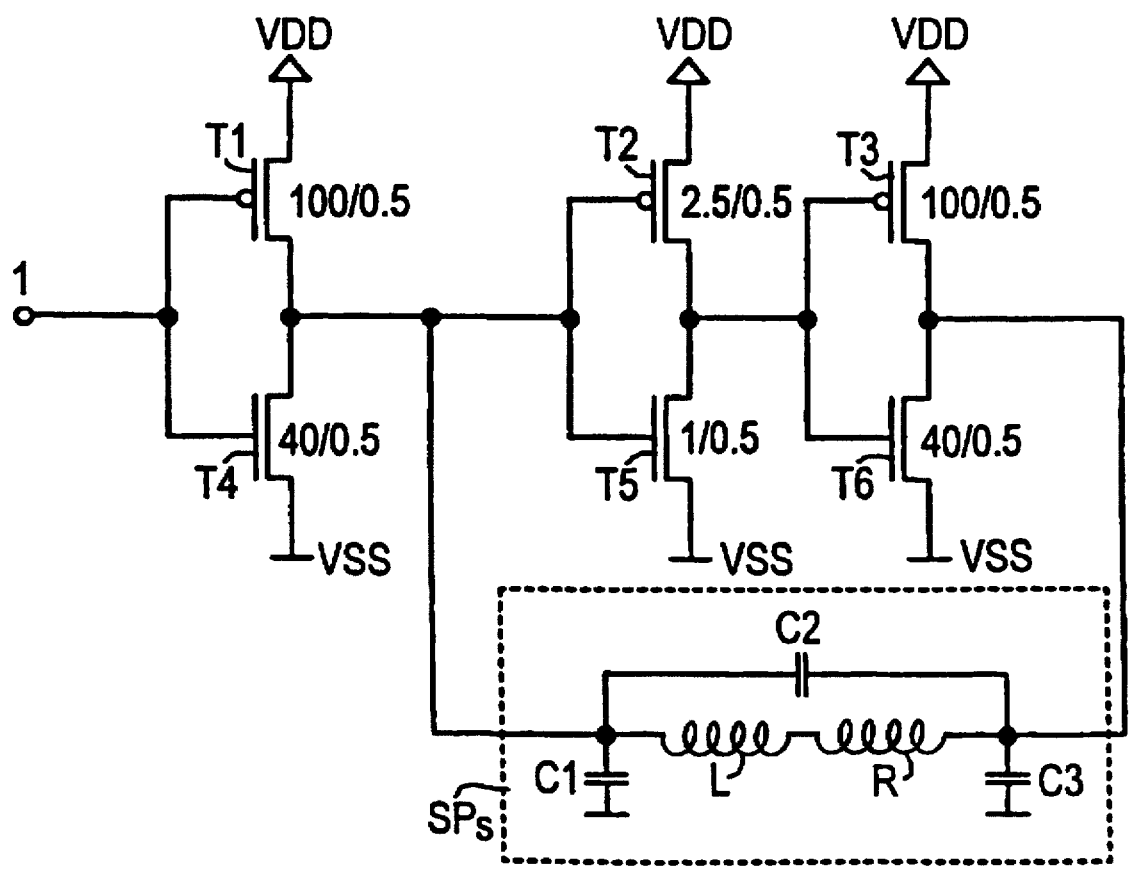
FIG. 4 is a detailed circuit diagram of the transmission stage of FIG. 3.

FIG. 4 shows an embodiment of the transmission stage S, wherein three p-channel field effect transistors T1 . . . T3 and three n-channel transistors T4 . . . T6 are provided, and whereby the transistors T1 and T4 forming the first inverter I1, the transistors T2 and T5 forming the second inverter I2 and the transistors T3 and T6 forming the third inverter I3. The inverters I1, I2 and I3 are respectively supplied with the supply voltages VDD and VSS. The transmission coil $SP_S$ shown in FIG. 3 is replaced in FIG. 4 by the equivalent circuit diagram in the form of a bridged π-circuit. The equivalent circuit diagram has an inductance L and a resistor R connected in series, these being bridged by a parasitic capacitor C2, and the two ends of the series circuit of the inductance L and the resistor R are connected to ground potential VSS via parasitic capacitors C1 and C3. The inverter I1 formed of the transistors T1 and T4 drives the transmission coil. The steepness of the leading edges of the current pulses of the coil current $I_L$ can be controlled via the edge steepness of the transmission input signal at the input 1 and by the dimensioning of the inverter I1. The trailing edge of the current pulses, and thus their duration as well, are set via the inverters I2 and I3. Since the current $I_L$ always flows only briefly through the coil, the static transmitter uses no power.

The channel widths of the transistors T1 . . . T6 in the transmission means S amount, for example, to 100 μm, 2.5 μm, 100 μm, 40 μm, 1 μm, and 40 μm in sequence and the channel lengths of the transistors T1 . . . T6 respectively amount to 0.5 μm.

Figure 5:
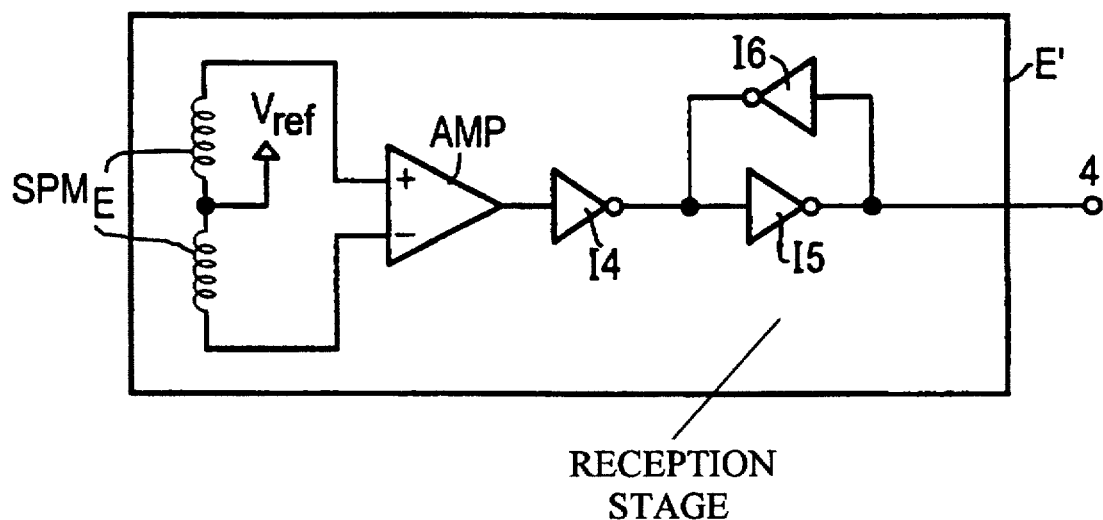
FIG. 5 is a schematic circuit diagram of a first embodiment of a reception stage of an inventive arrangement.

FIG. 5 shows a schematic circuit diagram of a first embodiment (designated with a prime) of the reception stage E. The reception stage E' contains a reception coil $SPM_E$ with a center tap, the center tap being connected to a reference potential $V_{ref}$. The terminal of a first part of the coil $SPM_E$ that is not connected to the reference potential is connected to the non-inverting input of a amplifier AMP and the terminal of the second part of the coil $SPM_E$ not connected to the reference potential is connected to the inverting input of the differential amplifier AMP. The output of the differential amplifier AMP is connected via an inverter I4 to the input of an inverter I5 and to the output of an inverter I6. The inverters I5 and I6 are connected in parallel with opposite polarity and form a latch. The output of the inverter I5 and the input of the inverter I6 are connected to the output 4 of the reception stage E'.

Figure 6:
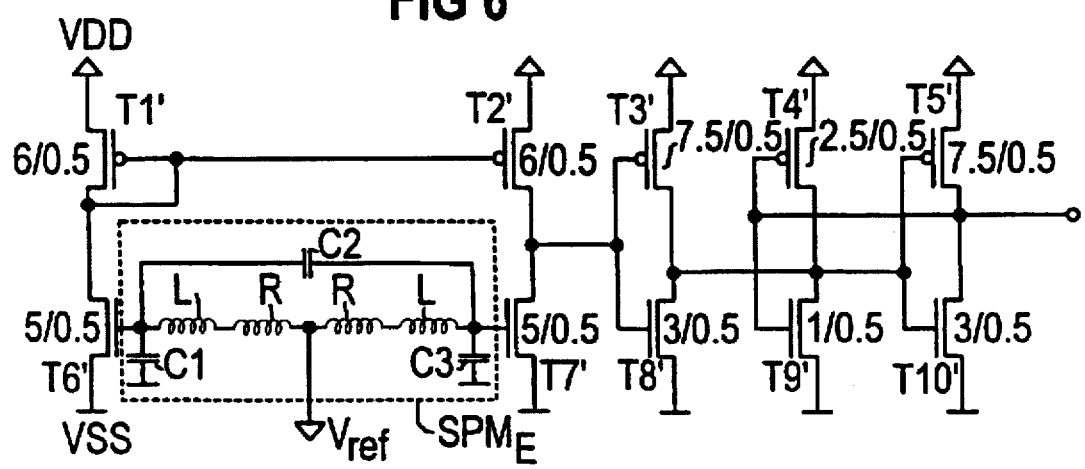
FIG. 6 is a detailed circuit diagram of a reception stage according to the functional principles of FIG. 5.

FIG. 6 shows an embodiment of the reception stage E' with five p-channel transistors T1'...T5' and five n-channel transistors T6'...T10' and with the equivalent circuit diagram of the coil $SPM_E$ with center tap. The transistors T1' and T6' and the transistors T2 and T7' respectively form branches of the differential amplifier AMP. One terminal of each transistor T1' and T2' is connected to the supply voltage VDD and one terminal of each transistor T6' and T7' is connected to the supply voltage VSS. The respective gate terminals of the transistors T1' and T2' are connected to the junction of the two transistors T1' and T6'. For each part of the coil, the equivalent circuit diagram of the coil $SPM_E$ is composed of an inductance L and a series resistor R of the coil connected in series, both inductances and internal resistors being bridged by a parasitic capacitor C2. The ends of the bridged series circuit are connected to the inputs of the differential amplifier, corresponding to the gate terminals of the transistors T6' and T7' and which are connected to ground potential VSS via parasitic capacitors C1 and C3 of the equivalent circuit diagram of the coil $SPM_E$. The transistors T3' and T8' form the inverter I4, the transistors T5' and T6' form the inverter I5 and the transistors T4' and T9' form the inverter I6.

The channel widths of the transistors T1'...T10' can be selected, for example, as 6 μm, 6 μm, 7.5 μm, 2.5 μm, 7.5 μm, 5 μm, 5 μm, 3 μm, 1 μm and 3 μm in sequence. The channel lengths of the transistors T1'...T10' can be respectively selected, for example, at 0.5 μm.

The voltage oppositely induced in the two sub-coils upon reception of a transmission pulse is amplified by the differential amplifier unit. The inverter I4 formed of the transistors T3' and T8' serves for further amplification of the signal and for decoupling of the differential amplifier unit AMP and the latch formed of the inverters I5 and I6. The amplified pulses are thereby converted into a static CMOS level by the latch.

FIG. 7 shows a circuit diagram of a further embodiment (designated with a double prime) of the reception stage E. In the reception stage E", a coil $SP_E$ is connected at one side to a reference potential $V_{ref}$ its other terminal is connected to the inverting input of a differential amplifier AMP'. The non-inverting input of the differential amplifier AMP' is connected via a resistor R1 to the reference potential $V_{ref}$ and to a terminal of the coil via a resistor R2, there is a feedback loop from the output to the non-inverting input of the differential amplifier AMP'. The differential amplifier AMP' thus operates with hysteresis. The output of the differential amplifier AMP' is connected to the output 4 of the reception stage E" via an inverter I7.

FIG. 8 shows a detailed circuit of a reception stage E" of FIG. 7 and contains two p-channel transistors T1" and T2" as well as four n-channel transistors T3"...T6" and an equivalent circuit for a coil $SPM_E$ with center tap, as described in greater detail in FIG. 5 and FIG. 6. The transistors T1" and T4" as well as the transistors T2" and T6" are connected in series in pairs between the supply voltages VDD and VSS. The respective gate terminals of the transistors T1" and T2" are connected to the junction between the two transistors T1" and T4". The junction between transistors T1" and T4" is connected to the supply voltage VSS via a series circuit of the transistors T3" and T5". The gate terminal of the transistor T3" is connected to the junction between the transistors T2" and T6", which simultaneously represents the output 4. The gate terminals of the transistors T4" and T5" are connected to an end of the coil $SPM_E$ and the gate terminal of the transistor T6" is connected to the other end of the coil $SPM_E$. The conversion of the transmitter voltage pulses into static signals is thereby assured by a hysteresis in the comparator circuit. During static operation, the transistors T4", T5" and T6" are basically connected as current sources. The transistors T1" and T2" form a current mirror. The hysteresis is achieved by activation and deactivation of the current source formed by the transistor T5" dependent on the output signal, whereby the transistor T3" is inhibited given a low level at the output 4, and thus the current mirrored to the transistor T2" is so small that the transistor T6" is operated in the linear range with a low drain-source voltage, as a result of which the output level at the output 4 remains low. A high level is also correspondingly held at the output 4. When a signal pulse is transmitted, then the voltage pulse generated in the receiver coil $SPM_E$ triggers a trigger event in the reception stage E".

The reference potential $V_{ref}$ in the two reception stage embodiments E' and E" can, for example, be a d.c. voltage of approximately 1 volt and, for example, can be realized by a current mirror.

The function of the circuits was verified by simulation for coupling inductances down to 5 nH and frequencies above 200 MHz.

Although modifications and changes may be suggested by those skilled in the art, it is the intention of the inventors to embody within the patent warranted hereon all changes and modifications as reasonably and properly come within the scope of their contribution to the art.

We claim as our invention:

1. A vertically integrated circuit comprising:
   a first integrated chip layer containing a first circuit portion;
   a second integrated chip layer disposed in a stack on said first integrated chip layer and containing a second circuit portion, said first and second circuit portions comprising portions of a single integrated circuit; and
   coupling inductive means disposed in said stack for inductively transmitting a signal in said single integrated circuit between said first and second circuit portions.

2. A vertically integrated circuit as claimed in claim 1 wherein said first circuit portion comprises means for transmitting said signal and wherein said second circuit portion comprises means for receiving said signal, and wherein said coupling inductive means comprises a first coil disposed in said first integrated chip layer laterally of said means for transmitting and a second coil disposed in said second integrated chip layer laterally of said means for receiving and separated from said first coil.

3. A vertically integrated circuit as claimed in claim 2 wherein said means for receiving comprises a comparator with hysteresis having inputs connected to said second coil.

4. A vertically integrated circuit as claimed in claim 2 wherein said means for receiving comprises a comparator having inputs connected to said second coil, followed by a latch.

5. A vertically integrated circuit as claimed in claim 2 wherein said means for transmitting comprises a signal delay unit connected to said first coil.

6. A vertically integrated circuit as claimed in claim 2 wherein said means for transmitting comprises means for transmitting an original signal and a complement of said original signal and wherein said means for receiving comprises means for receiving said original signal and said complement of said original signal, and wherein said coupling inductive means comprises means for inductively coupling said original signal between said means for transmitting and said means for receiving, and said vertically integrated circuit arrangement comprising further coupling inductive means for inductively coupling said complement of said original signal between said means for transmitting and said means for receiving, said further coupling inductive means comprising a further first coil disposed laterally of said first coil in said first integrated chip layer and a further second coil disposed laterally of said second coil in said second integrated chip layer and separated from said further first coil.

7. A vertically integrated circuit as claimed in claim 1 wherein said first circuit portion comprises means for transmitting an original signal and a complement of said original signal and wherein said second circuit portion comprises means for receiving said original signal and said complement of said original signal, wherein said coupling inductive means comprises means for inductively coupling said original signal between said means for transmitting and said means for receiving, and said vertically integrated circuit comprising further coupling inductive means in said stack for inductively coupling said complement of said original signal between said means for transmitting and said means for receiving.

8. A vertically integrated circuit arrangement comprising:

a first integrated chip layer containing means for transmitting an original signal, and a complement of said original signal;

a second integrated chip layer disposed in a stack on said first integrated chip layer and containing means for receiving said original signal and said complement of said original signal;

first coupling inductive means disposed in said stack for inductively coupling said original signal between said means for transmitting and said means for receiving comprising a first coil disposed in said first integrated chip layer laterally of said means for transmitting and a second coil disposed in said second integrated chip layer laterally of said means for receiving and separated from said first coil; and second coupling inductive means disposed in said stack for inductively coupling said complement of said original signal between said means for transmitting and said means for receiving comprises a third coil disposed laterally of said first coil in said first integrated chip layer and a fourth coil disposed laterally of said second coil in said second integrated chip layer and separated from said third coil.

9. A vertically integrated circuit arrangement comprising:

a first integrated chip layer containing means for transmitting an original signal and a complement of said original signal;

a second integrated chip layer disposed in a stack on said first integrated chip layer and containing means for receiving said original signal and said complement of said original signal;

first coupling inductive means disposed in said stack for inductively coupling said original signal between said means for transmitting and said means for receiving; and second coupling inductive means disposed in said stack for inductively coupling said complement of said original signal between said means for transmitting and said means for receiving.

* * * * *